(12) United States Patent
Aikawa et al.

(10) Patent No.: US 8,530,987 B2
(45) Date of Patent: Sep. 10, 2013

(54) MAGNETIC MEMORY INCLUDING A MAGNETORESISTIVE ELEMENT

(75) Inventors: Hisanori Aikawa, Yokohama (JP); Tadashi Kai, Tokyo (JP); Masahiko Nakayama, Yokohama (JP); Sumio Ikegawa, Yokohama (JP); Naoharu Shimomura, Tokyo (JP); Eiji Kitagawa, Yokohama (JP); Tatsuya Kishi, Yokohama (JP); Jyunichi Ozeki, Yokohama (JP); Hiroaki Yoda, Sagamihara (JP); Satoshi Yanagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/432,486

(22) Filed: Mar. 28, 2012

(65) Prior Publication Data

US 2012/0241884 A1 Sep. 27, 2012

Related U.S. Application Data

(63) Continuation of application No. PCT/JP2009/006775, filed on Sep. 28, 2009.

(51) Int. Cl.
*H01L 29/82* (2006.01)
*G11C 11/02* (2006.01)

(52) U.S. Cl.
USPC ............ 257/421; 257/427; 257/E29.323; 438/3; 365/157; 365/158; 360/324.2; 360/326

(58) Field of Classification Search
USPC ............ 257/20, 414, 421–427, E29.323; 438/3; 360/324–326, 313; 365/157–158, 365/171–173; 39/737
See application file for complete search history.

(56) References Cited

U.S. PATENT DOCUMENTS

2007/0070689 A1* 3/2007 Ikegawa et al. .......... 365/171
2009/0224342 A1 9/2009 Nakayama et al.

FOREIGN PATENT DOCUMENTS

| JP | 2003-324225 | 11/2003 |
|---|---|---|
| JP | 2004-146688 | 5/2004 |
| JP | 2005-174969 | 6/2005 |
| JP | 2007-027575 | 2/2007 |
| JP | 2007-150265 | 6/2007 |
| JP | 2008-252036 | 10/2008 |
| JP | 2009-099628 | 5/2009 |

OTHER PUBLICATIONS

J. C. Slonczewski, "Current-driven excitation of Magnetic multilayers", Journal of Magnetism and Magnetic Materials 159 (1996), pp. L1-L7.

(Continued)

*Primary Examiner* — Jami M Valentine
(74) *Attorney, Agent, or Firm* — Oblon, Spivak, McClelland, Maier & Neustadt, L.L.P.

(57) ABSTRACT

A magnetic memory includes a magnetoresistive element. The magnetoresistive element includes a reference layer having an invariable magnetization direction, a storage layer having a variable magnetization direction, and a spacer layer provided between the reference layer and the storage layer. The storage layer has a multilayered structure including first and second magnetic layers, the second magnetic layer is provided between the first magnetic layer and the spacer layer and has a magnetic anisotropy energy lower than that of the first magnetic layer, and an exchange coupling constant Jex between the first magnetic layer and the second magnetic layer is not more than 5 erg/cm$^2$.

7 Claims, 11 Drawing Sheets

(56) References Cited

OTHER PUBLICATIONS

Z. Li et al., "Thermally assisted magnetization reversal in presence of a spin-transfer torque", Physical Review B 69, 134416 (2004), pp. 1-6.

Japanese International Search Report mailed Dec. 15, 2009, in PCT/JP2009/066775 filed Sep. 28, 2009, (with English translation of categories).

Japanese Written Opinion mailed Dec. 15, 2009, in PCT/JP2009/066775 filed Sep. 28, 2009.

* cited by examiner

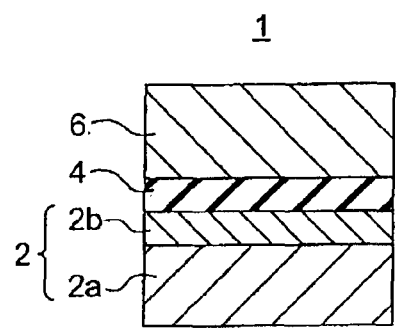
F I G. 2
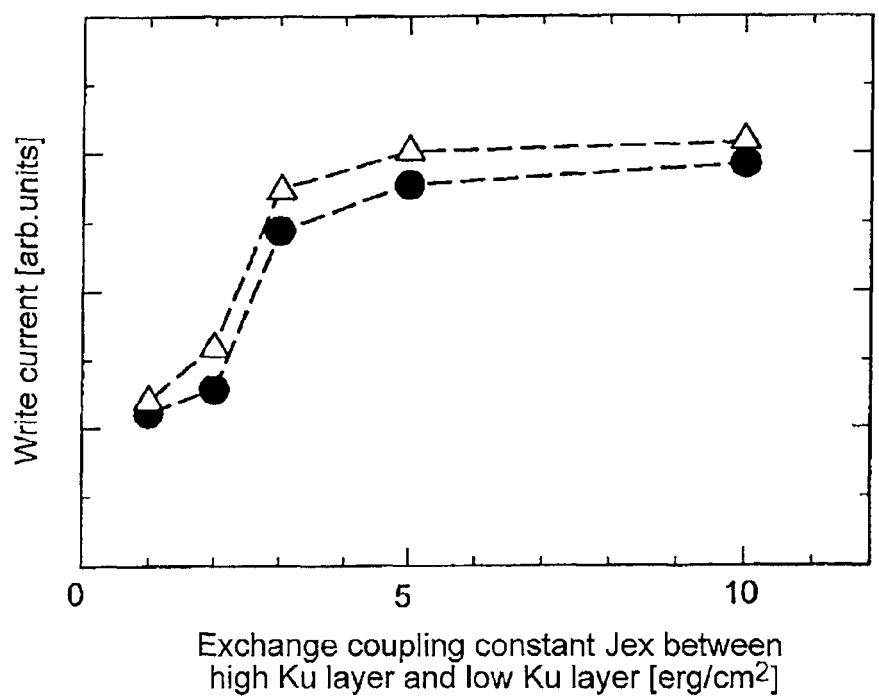
F I G. 3

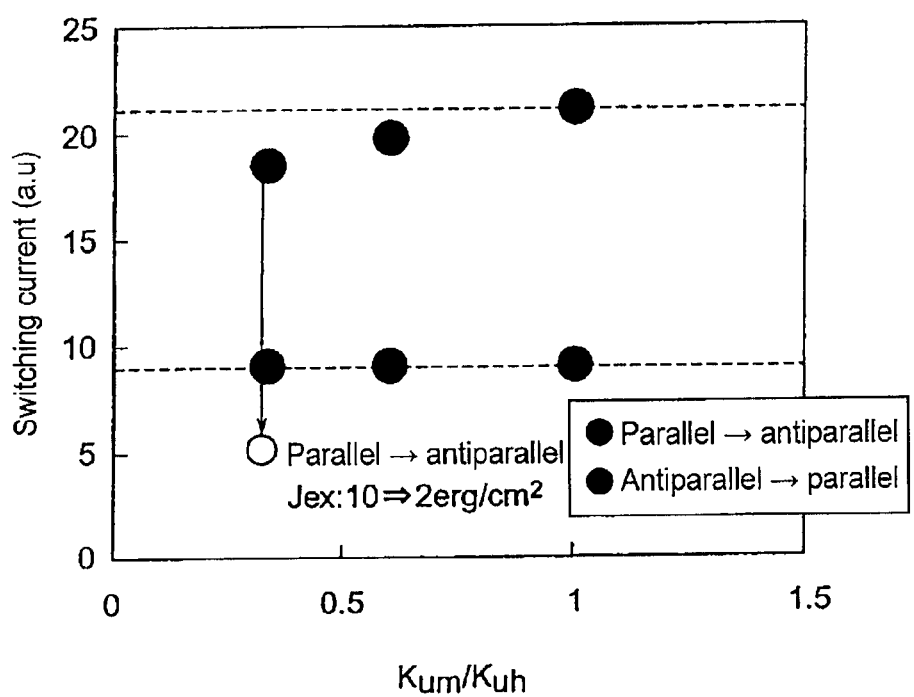
F I G. 8

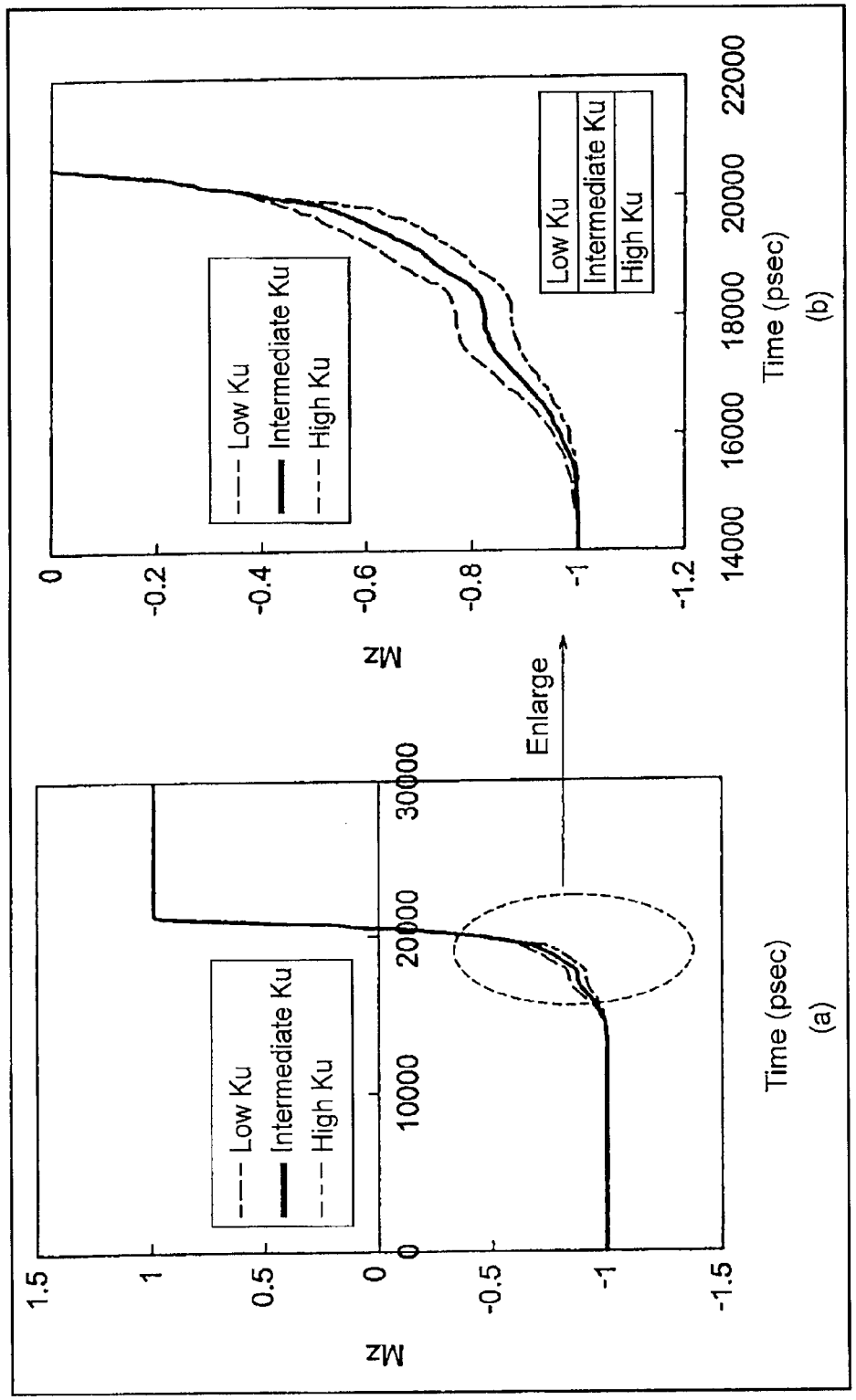
F I G. 9

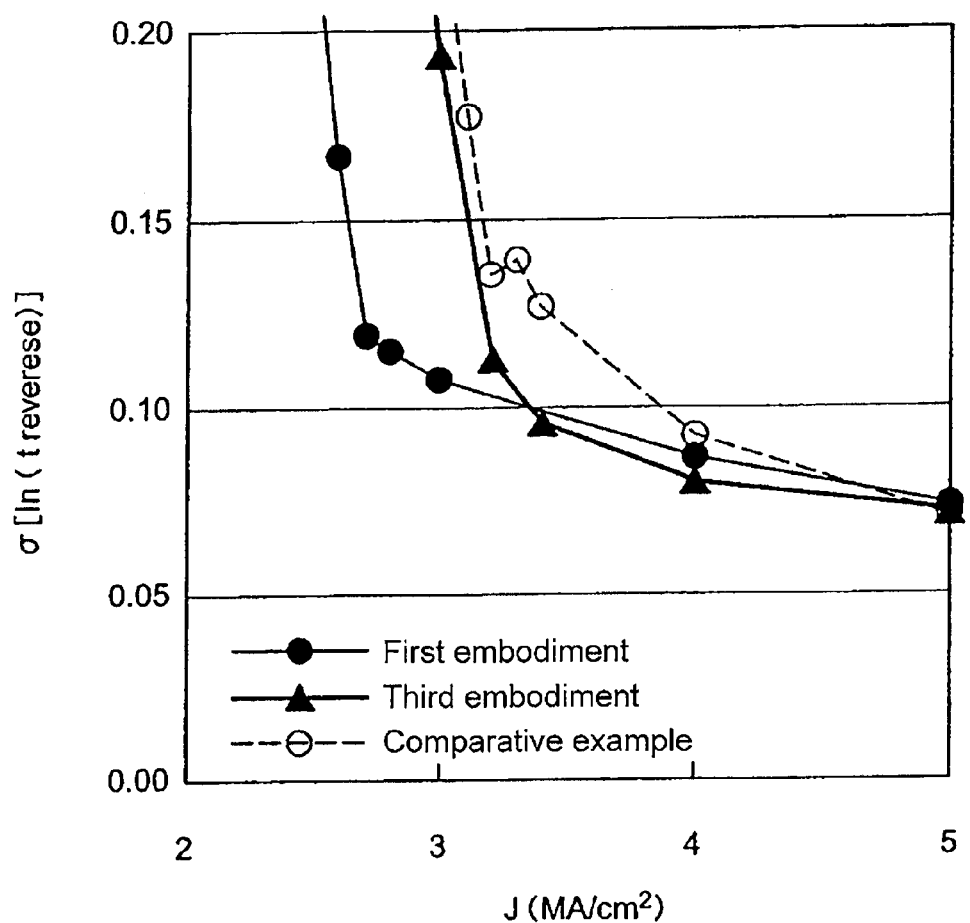
F I G. 12

MAGNETIC MEMORY INCLUDING A MAGNETORESISTIVE ELEMENT

CROSS REFERENCE TO RELATED APPLICATIONS

This application is a Continuation application of PCT Application No. PCT/JP2009/066775, filed Sep. 28, 2009, the entire contents of which are incorporated herein by reference.

FIELD

Embodiments described herein relate generally to a magnetic memory.

BACKGROUND

In recent years, an MRAM (Magnetoresistive Random Access Memory) using an MTJ (Magnetic Tunnel Junction) element has received a great deal of attention. It can operate at a high speed and is therefore usable as a working memory, like a DRAM. In addition, the MRAM is highly advantageous in making a system power-thrifty and faster because it is a nonvolatile memory.

The MTJ element includes a reference layer made of a ferromagnetic material having a predetermined magnetization direction, a storage layer made of a ferromagnetic material having a variable magnetization direction, and a spacer layer sandwiched between them. The tunnel resistance between the reference layer and the storage layer takes a high resistance state or a low resistance state depending on the relative magnetization arrangement of the two ferromagnetic layers. For example, pieces of information (data) "0" and "1" are associated with the resistance states, respectively, thereby storing the information. Normally, the low resistance state is set when the magnetization arrangement is parallel, and the high resistance state is set when the magnetization arrangement is antiparallel. Note that pieces of information (data) "1" and "0" may be associated with the low resistance state and the high resistance state, respectively.

In general, an MRAM (to be also referred to as a magnetic memory hereinafter) includes at least one memory cell. The memory cell includes an MTJ element serving as a memory element, and a select transistor configured to select the MTJ element.

As a data write method, there exists a spin transfer torque method which changes the magnetization direction of the storage layer by a spin transfer torque. Magnetization reversal is caused by supplying a current with a predetermined value or more to the MTJ element. The current flowing direction is changed to change the storage layer and the reference layer from the parallel magnetization state to the antiparallel state or from the antiparallel state to the parallel state, thereby writing data. This MRAM is particularly called a spin transfer torque MRAM. To make the spin transfer torque MRAM more competitive than other memories such as a flash memory and a DRAM, it is necessary to reduce the area of one memory cell and thus reduce the area of the entire chip. To do this, it is most important to reduce the write current value. Generally, when the write current value decreases, the memory holding time shortens. That is, they have a tradeoff relationship. The memory holding time is largely affected by the thermal stability of the storage layer. Hence, reducing the write current while maintaining the thermal stability of the storage layer is the key to the technique.

In addition, to make the spin transfer torque MRAM have superiority over other memories, not only the above-described reduction of the write current but also suppressing the write, read, and memory holding error rates are very important.

Magnetization reversal caused by a spin transfer torque is a Poisson process that occurs with the aid of thermal energy of room temperature, that is, phonons. This is substantially a probabilistic phenomenon. A write current $I_c$ of magnetization reversal has an amount that substantially fluctuates in each attempt due to the influence of phonons. The fluctuation width depends on the magnetization reversal process or the pulse width of a given current. The probability of magnetization reversal of the MTJ element caused by the spin transfer torque can supposedly be expressed as a simple thermal activation process represented by $$P(\tau) = 1 - \exp\left[-\tau/\tau_0 \exp\left\{-\frac{\Delta E_a}{k_B T}\left(1 - \frac{I}{I_{c0}}\right)\right\}\right] \quad (1)$$

where $\tau$ (sec) is the pulse width of the current, $\tau_0$ is an amount called an attempt time which is normally 1 (sec), $\Delta E_a$ is the anisotropy energy of the storage layer, whose ratio $\Delta E_a/k_B T$ to energy $k_B T$ of the phonons represents the thermal stability of the storage layer, I (A) is the magnitude of the supplied current, and $I_{c0}$ (A) is the reversal current at absolute zero.

In data read, data is discriminated using the resistance difference between the high resistance state and the low resistance state of the MTJ element. Hence, in the data read as well, the current (read current) is directly supplied to the MTJ element, as in the data write. In the spin transfer torque MRAM, the read current is normally set to be much smaller than the write current. However, as is apparent from equation (1), the reversal threshold fluctuates in each read attempt. For this reason, in the read performed, for example, $10^{15}$ times, the probability that the magnetization reversal erroneously occurs cannot be neglected even if a small read current is supplied. To suppress the read error, it is necessary to suppress the fluctuation of the threshold.

The threshold of the write current also varies in a similar manner. Hence, the set value of the write current needs to be larger than an average threshold. It is therefore necessary to suppress the fluctuation of the threshold to make the write current smaller and prevent write errors.

As can be seen from equation (1), the fluctuation of the reversal threshold becomes smaller as the anisotropy energy $\Delta E_a$ of the storage layer increases. The memory holding time becomes longer as the anisotropy energy $\Delta E_a$ of the storage layer increases. Normally, the anisotropy energy of the storage layer and a write current $I_{c0}$ at absolute zero are known to have a positive correlation. In particular, they have a proportional relationship when the storage layer has a perpendicular magnetic anisotropy. Hence, when the anisotropy energy of the storage layer is simply increased, the write current becomes large, although the fluctuation of the reversal threshold can be made smaller. To reduce the error rates and reduce the write current, reducing the write current while maintaining the thermal stability of the storage layer is a very important technical challenge.

As described above, since the magnetization reversal of a magnetic body is a probabilistic phenomenon, read errors, write errors, memory holding errors, and the like occur. It is possible to provide, in the nonvolatile memory, a circuit that corrects errors even if the above-described errors have occurred in a small amount. This processing is done using a method called ECC (Error Correction Coding). However, to prevent the operation errors of the MRAM, it is important to understand the probabilistic phenomenon of magnetization reversal of a magnetic body and control it to reduce error rates.

BRIEF DESCRIPTION OF THE DRAWINGS

FIG. 2 is a sectional view showing a magnetoresistive element used in the first embodiment.

FIG. 3 is a graph showing the dependence on the exchange coupling constant between magnetic layers concerning a write current.

FIG. 8 is a graph showing the result of LLG simulations for proving reduction of the spin transfer torque reversal current.

FIG. 9 is a graph showing the time dependence of magnetization in spin transfer torque reversal of the magnetoresistive element.

FIG. 12 is a graph that plots the a values of the logarithmic normal distribution of t-reverse as the function of a current density J.

DETAILED DESCRIPTION

In general, according to one embodiment, a magnetic memory comprising a magnetoresistive element, the magnetoresistive element comprising a reference layer having an invariable magnetization direction; a storage layer having a variable magnetization direction; and a spacer layer provided between the reference layer and the storage layer, and wherein the storage layer has a multilayered structure including a first magnetic layer and a second magnetic layer, the second magnetic layer is provided between the first magnetic layer and the spacer layer and has a magnetic anisotropy energy lower than that of the first magnetic layer, and an exchange coupling constant Jex between the first magnetic layer and the second magnetic layer is not more than 5 erg/cm$^2$.

The present inventors have found the condition to reduce a reversal current (write current), and details thereof will be described before an explanation of the embodiments.

Figure 1:
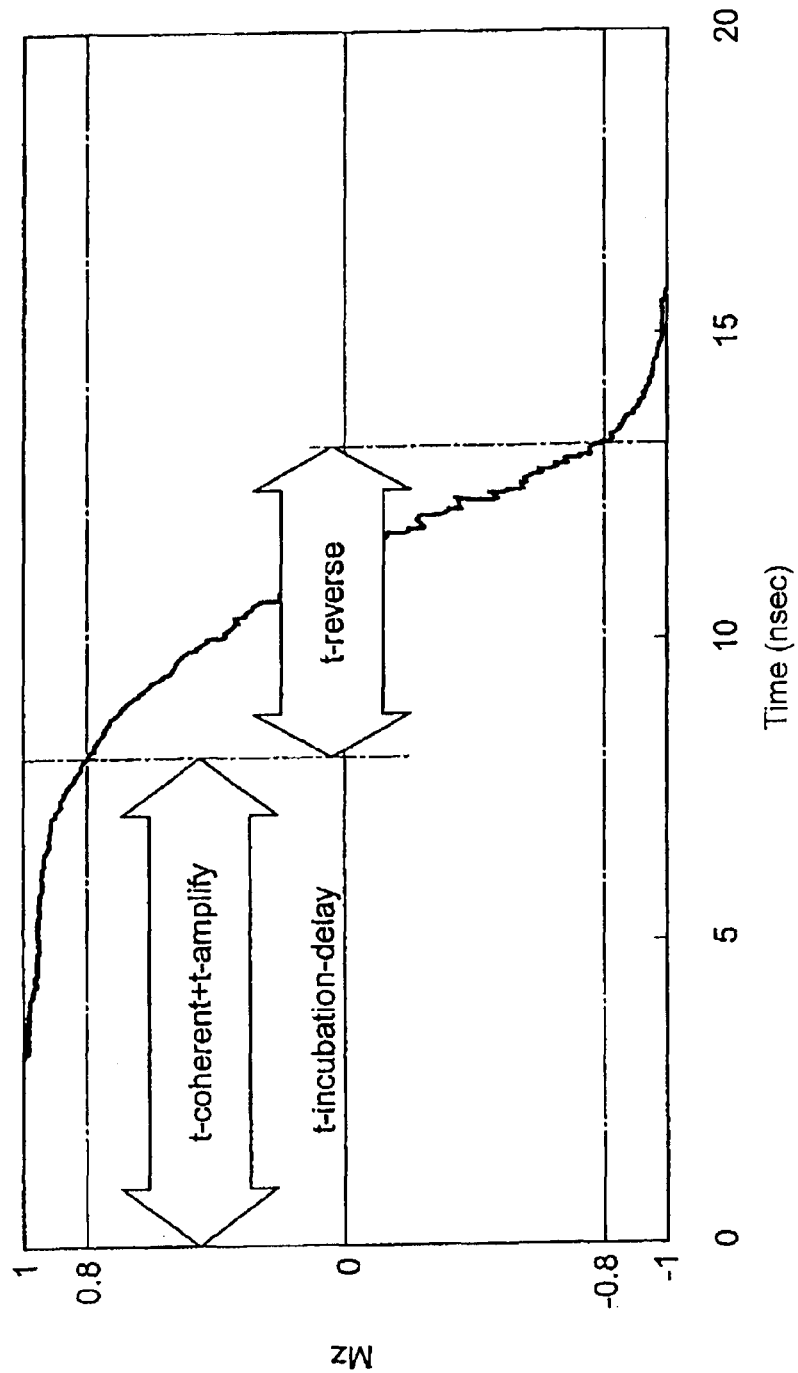
FIG. 1 is a graph showing the result of numerical simulations of the reversal probability in spin transfer torque reversal.

The present inventors have found from actual experiments and numerical simulations that the reversal probability of spin transfer torque reversal cannot be represented by equation (1). FIG. 1 shows the result of the numerical simulations (LLG (Landau-Liftshitz-Gilbert) simulations). As is apparent from FIG. 1, the process of magnetization reversal is divided by several characteristic times. The present inventors have found that when equation (1) is expanded, the process can approximately be represented by $$P(\tau) = 1 - \exp\left\{-(\tau/\tau_0)/\tau_0 \exp\left[-\frac{\Delta E_a}{k_B T}\left(1 - \frac{I}{I_{c0}}\right)^n\right]\right\} \quad (2)$$

where n is a constant of 1.5 to 2. As the parameters used in the calculation shown in FIG. 1, the storage layer has perpendicular magnetization, the magnetic anisotropy energy Ku=5.87 Merg/cm$^3$, a saturation magnetization M$_s$=1,000 emu/cm$^3$, a film thickness t of the MTJ element=3.09 nm, and the MTJ diameter=φ30 nm. In this case, an energy barrier ΔE$_a$ of magnetization reversal is 79 k$_B$T. At a temperature of 300K, calculation was performed within the range of a current density J (the quotient of the current value divided by the area of the MTJ element) of the current supplied to the MTJ element=2 to 7 MA/cm$^2$. Without supplying a current, a magnetization direction Mz perpendicular to the film surface of the storage layer is +1. After the spin transfer torque reversal, Mz=−1. The time during this will be defined as a switching time t$_{sw}$. The present inventors have found that spin transfer torque reversal that is the write principle of the MRAM includes the following three stages, as is apparent from FIG. 1. Hence, the switching time t$_{sw}$ is divided into three parts.

In the first stage, the respective portions of the storage layer that are separately in a precession state start the precession coherently. This time will be referred to as t-coherent. Mz changes from 1 to about 0.95 during the time t-coherent. The time t-coherent largely fluctuates in each attempt because the precession starts to be coherent and then to be separate again due to the influence of phonons.

After the first stage, the coherent precession may be amplified accidentally. In the second stage, the magnetization direction Mz changes from 0.95 to about 0.8. This time will be referred to as t-amplify. The sum of the time t-coherent of the first stage and the time t-amplify of the second stage will be referred to as t-incubation-delay. The time t-incubation-delay is the time until the main stage of magnetization reversal starts, and is relatively long in the spin transfer torque reversal. As described above, since t-incubation-delay fluctuates, the write threshold also fluctuates.

In the third stage, the precession is further amplified, and magnetization reversal occurs with the aid of thermal agitation. This is the thermal activation process. The magnetization direction Mz changes from 0.8 to about −1. This time will be referred to as t-reverse. The fluctuation of t-reverse is small when the diameter of the MTJ element is smaller than a single magnetic domain diameter Ds. When the diameter of the MTJ element is larger than the single magnetic domain diameter Ds, t-reverse fluctuates as much as t-incubation delay. FIG. 1 shows the times t-incubation-delay and t-reverse.

As is apparent from the above explanation, an effective strategy for reducing the write current when the anisotropy energy of the storage layer is large is to shorten t-incubation-delay and t-reverse.

In addition, suppressing the fluctuation of the write threshold which leads to a write error or a read error translates to suppressing the fluctuation of the times t-incubation-delay and t-reverse.

First Embodiment

A magnetic memory according to the first embodiment will be described. The magnetic memory of this embodiment includes at least one memory cell. This memory cell includes a magnetoresistive element (to be also referred to as an MTJ element hereinafter) serving as a memory element. FIG. 2 illustrates the magnetoresistive element used in the magnetic memory of this embodiment. A magnetoresistive element 1 includes a storage layer 2 having a variable magnetization direction, a reference layer 6 having an invariable magnetization direction, and a spacer layer 4 provided between the storage layer 2 and the reference layer 6. The storage layer 2 having a variable magnetization direction means that the magnetization direction of the storage layer 2 can change when the angular momentum of spin-polarized electrons generated by supplying a current in a direction perpendicular to the film surface (for example, upper surface) of the storage layer 2 is transmitted to the electrons in the storage layer 2. The reference layer 6 having an invariable magnetization direction means that the magnetization direction of the reference layer does not change when a magnetization reversal current to reverse the magnetization direction of the storage layer 2 is supplied to the reference layer.

The storage layer 2 includes a layer (to be referred to as a high Ku layer hereinafter) 2a having a high magnetic anisotropy energy Ku and a layer (to be referred to as a low Ku layer hereinafter) 2b having a low magnetic anisotropy energy Ku. The low Ku layer is a magnetic layer with Ku of 10,000 $erg/cm^3$ or less. Ku is preferably lower than 1,000 $erg/cm^3$. The high Ku layer is a magnetic layer with Ku higher than 10,000 $erg/cm^3$. Ku is preferably higher than $1 \times 10^5$ $erg/cm^3$. Note that the high Ku layer 2a used in this embodiment has Ku of, for example, $1 \times 10^6$ $erg/cm^3$, and the low Ku layer 2b has Ku of 1,000 $erg/cm^3$. An intermediate Ku layer used in the second embodiment to be described later need only have Ku lower than that of the high Ku layer. The Ku value is preferably ½ or less of that of the high Ku layer. As the material of the high Ku layer, for example, an alloy of a magnetic element such as Fe or Co and a rare-earth element such as Nd, Sm, Gd, Tb, or Dy, an artificial lattice or an alloy of a magnetic element such as Fe or Co and a precious metal element such as Pt, Pd, Ir, Ru, Au, or Rh, a CoCr alloy, or the like is used. Ku can be adjusted more finely by adding a nonmagnetic metal element such as Cu, Ta, B, Al, Ga, Zr, V, or Ti to these materials. As the material of the low Ku layer, a magnetic layer containing Co, for example, CoFe, CoB, CoFeB, CoFeNi, CoFeNiB, or the like is used. Note that as the material of the spacer layer, for example, MgO, $Al_2O_3$, Cu, or Au is used.

In general, reducing the write current is largely affected by an exchange coupling strength (exchange coupling constant) Jex between the stacking interfaces of the magnetic layers. FIG. 3 shows a result of LLG simulations conducted while changing Jex. The diameter of the MTJ element was set to 30 nm. Calculation was performed for two cases in which the magnetic anisotropy energy Ku and volume of the high Ku layer 2a were changed so as to make the storage layer 2 attain the same average magnetic anisotropy energy. Full circles in FIG. 3 represent the calculation result when Ku=$1 \times 10^6$ $erg/cm^3$ and the film thickness=4 nm. Hollow triangles represent the calculation result when Ku=$1 \times 10^6$ $erg/cm^3$ and the film thickness=1 nm. As can be seen from FIG. 3, the write current abruptly decreases when the exchange coupling constant Jex is 5 $erg/cm^2$ or less in both cases. This reveals that setting Jex to 5 $erg/cm^2$ or less is suitable for reducing the write current. According to the calculation results, the write current decreases to 38% when the value of the exchange coupling constant changes from 10 $erg/cm^2$ to 2 $erg/cm^2$. It is important that at this time, only the values of the high Ku layer 2a and the low Ku layer 2b change, and the magnetic anisotropy energy of the storage layer 2 remains unchanged.

As is apparent from FIG. 3, the strength Jex of the exchange coupling between the high Ku layer 2a and the low Ku layer 2b is preferably 5 $erg/cm^2$ or less. More preferably, Jex is 2 $erg/cm^2$ or less, as will be described below. This arrangement allows to obtain a magnetoresistive element capable of guaranteeing a sufficiently long memory holding time and reducing the write current.

Figure 4:
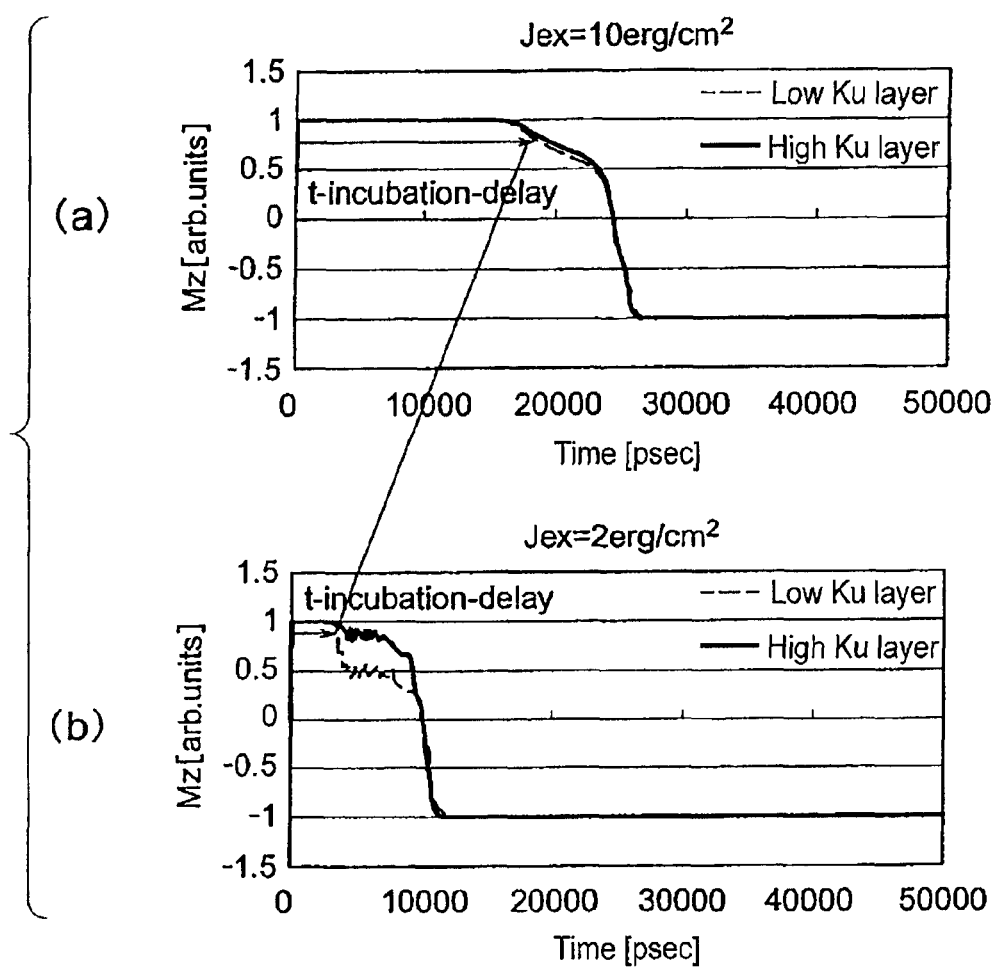
FIG. 4 is a graph showing the elapse of time of magnetization Mz when Jex=10 erg/cm$^2$ and when Jex=2 erg/cm$^2$.

FIGS. 4(a) and 4(b) show the elapse of time of magnetizations Mz of the high Ku layer 2a and the low Ku layer 2b when Jex=10 $erg/cm^2$ and Jex=2 $erg/cm^2$. As is apparent from FIGS. 4(a) and 4(b), the time t-incubation-delay until the magnetization Mzs starts coherent precession is shorter when Jex=2 $erg/cm^2$ than that when Jex=10 $erg/cm^2$. The probable reason is as follows. In spin transfer torque reversal, conduction electrons spin-polarized through the reference layer 6 transmit the spin torque to a portion of the storage layer 2 adjacent to the spacer layer 4, thereby causing magnetization reversal. Hence, when Jex is small, magnetization of the low Ku layer 2b on the side of the spacer layer 4 starts coherent precession earlier. As a result, t-incubation-delay remarkably shortens. In fact, when Jex=2 $erg/cm^2$, magnetization rotation of the low Ku layer 2b occurs earlier than the high Ku layer 2a, as is apparent from FIG. 4(b).

Figure 5:
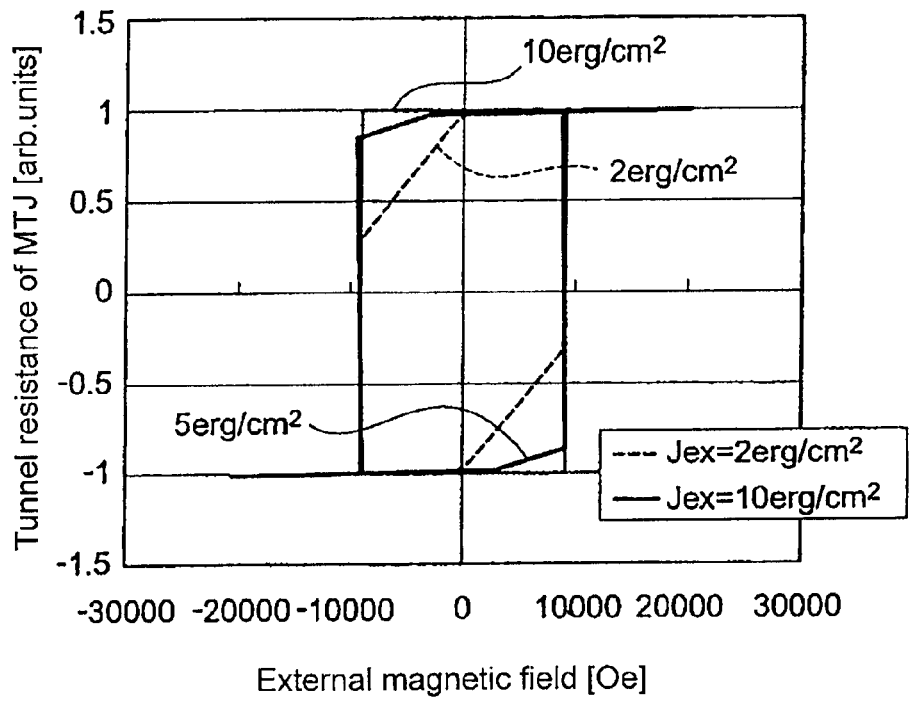
FIG. 5 is a graph showing the external magnetic field-resistance curve of an MTJ element.

To know whether Jex is actually 5 $erg/cm^2$ or less, the resistance of the magnetoresistive element 1 is measured while applying an external magnetic field to the magnetoresistive element 1. FIG. 5 shows the external magnetic field-resistance curve obtained by this measurement. As is apparent from FIG. 5, when the exchange coupling constant Jex is larger than 5 $erg/cm^2$, the resistance value behaves to maintain a predetermined value until it steeply changes. On the other hand, when Jex=5 $erg/cm^2$ or less, the resistance has a predetermined value within the range where the external magnetic field up to zero is applied in the same direction as the magnetization of the storage layer. When the external magnetic field is applied in the direction opposite to the magnetization of the storage layer, the resistance decreases. A state in which the resistance value immediately before the magnetization reversal decreases to 90% the resistance value for a magnetic field of 0 corresponds to Jex=5 $erg/cm^2$ or less. The write current decreases when Jex=5 $erg/cm^2$ or less because the low Ku layer causes magnetization reversal earlier, as described above. This can be regarded as the same as the phenomenon that the magnetization of the low Ku layer changes earlier upon magnetic field sweeping, and the resistance value immediately before reversal decreases. Hence, the value of the exchange coupling Jex between the high Ku layer and the low Ku layer can be known in the above-described way.

Figure 6:
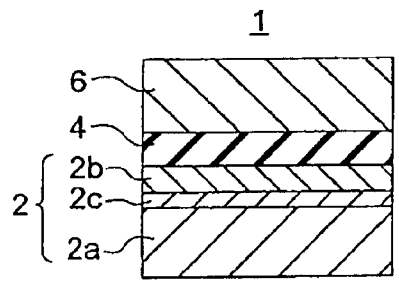
FIG. 6 is a sectional view showing a magnetoresistive element used in a modification of the first embodiment.

The value of the exchange coupling constant between adjacent magnetic bodies continuously formed in vacuum without inserting any intermediate layer is generally 10 $erg/cm^2$ or more. Hence, it is necessary to make the value of the exchange coupling constant smaller than 10 $erg/cm^2$ using some technique. To control the exchange coupling constant Jex, for example, a thin nonmagnetic layer or a magnetic metal layer 2c is inserted between the high Ku layer 2a and the low Ku layer 2b, as in a modification of the embodiment shown in FIG. 6. Examples of the nonmagnetic metal to be used actually are single substances such as B, Mg, Al, Si, Ti, V, Cr, Mn, Cu, Zn, Zr, Nb, Mo, Ru, Rh, Pd, Ag, Cd, In, Sn, Hf, Ta, W, Re, Os, Ir, Pt, and Au, and alloys, oxides, and nitrides thereof. Note that the nonmagnetic layer or metal layer 2c to adjust Jex to a desired value has a different film thickness. When the nonmagnetic layer or magnetic metal layer 2c is inserted between the high Ku layer 2a and the low Ku layer 2b, interdiffusion between the high Ku layer 2a and the low Ku layer 2b can be suppressed, and a magnetic memory having high heat resistance can be attained. The magnetic metal layer to be inserted need only be an alloy layer containing Fe, Ni, and Co or at least one of them.

Jex may be adjusted by reforming the interface. Which one of the low Ku layer and the high Ku layer should be formed first is placed within the range of the magnetic memory design. When one of the layers is formed and exposed to $O_2$ or $O_3$ in an adjusted pressure or subjected to a plasma treatment in it, and the next layer is then stacked, an oxide layer with a well-controlled interface can be obtained, and Jex can be adjusted to a desired value. That is, the layer 2c inserted between the high Ku layer 2a and the low Ku layer 2b is an oxide layer. As a simpler method, the structure is put on standby in a stocker or the like for a predetermined time before formation of the magnetic layer. Since the surface is reformed by slight leakage in the film forming apparatus, Jex can be made smaller. The interface may be modified by exposing it to the plasma of an inert gas such as Ar, Kr, or Xe or performing annealing.

It is possible to set Jex to 5 erg/cm$^2$ or less by combining some of the above-described methods of adjusting Jex.

Generally, when a saturation magnetization Ms of the high Ku layer 2a and that of the low Ku layer 2b are different, the effect of reducing Jex is more conspicuous. To set Jex to 5 erg/cm$^2$ or less, the saturation magnetization Ms of the low Ku layer 2b is preferably larger than 1.2 times the saturation magnetization Ms of the high Ku layer 2a.

As described above, according to this embodiment, even when the storage layer has a high magnetic anisotropy energy, setting the exchange coupling strength Jex between the high Ku layer 2a and the low Ku layer 2b to 5 erg/cm$^2$ or less allows to reduce the write current without deteriorating the thermal stability of the storage layer.

Second Embodiment

Figure 7:
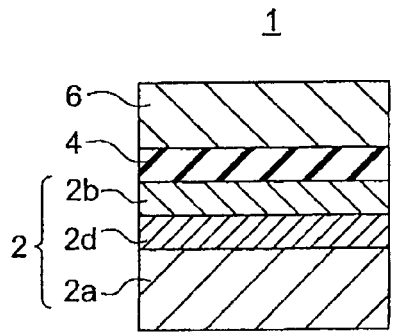
FIG. 7 is a sectional view showing a magnetoresistive element used in the second embodiment.

A magnetic memory according to the second embodiment will be described next. The magnetic memory of this embodiment includes at least one memory cell. This memory cell includes a magnetoresistive element serving as a memory element. FIG. 7 illustrates the magnetoresistive element used in the magnetic memory of this embodiment. A magnetoresistive element 1 includes a storage layer 2, a reference layer 6, and a spacer layer 4 provided between the storage layer 2 and the reference layer 6. The storage layer 2 includes a high Ku layer 2a, a low Ku layer 2b, and a magnetic layer (to be referred to as an intermediate Ku layer hereinafter) 2d provided between the high Ku layer 2a and the low Ku layer 2b and having Ku lower than that of the high Ku layer 2a and higher than that of the low Ku layer 2b. This arrangement allows to reduce the write current. The mechanism will be described below.

In spin transfer torque reversal, conduction electrons spin-polarized through the reference layer 6 transmit the spin torque to a portion of the storage layer 2 adjacent to the spacer layer, thereby causing magnetization reversal. That is, the magnetization reversal starts from the low Ku layer 2b adjacent to the spacer layer 4 and gradually propagates to the high Ku layer 2a. In the magnetoresistive element 1 shown in FIG. 7, the intermediate Ku layer 2d is inserted between the high Ku layer 2a and the low Ku layer 2b. For this reason, the magnetization reversal that occurs from the low Ku layer 2b propagates to the high Ku layer 2a through the intermediate Ku layer 2d. In a general magnetic body, the lower Ku is, the more easily the magnetization reversal occurs. Hence, as compared to the first embodiment in which the high Ku layer 2a is directly stacked on the low Ku layer 2b, inserting the intermediate Ku layer 2d makes it possible to smoothly propagate the magnetization reversal through the low Ku layer 2b, the intermediate Ku layer 2d, and the high Ku layer 2a in this order so that the spin transfer torque reversal readily occurs.

FIG. 8 shows the result of LLG simulations that proved reduction of the spin transfer torque reversal current in the magnetoresistive element 1 used in this embodiment. In the calculation, a composite perpendicular magnetic anisotropy $K_{ueff}$ of the high Ku layer 2a and the intermediate Ku layer 2d was kept constant. Letting $K_{uh}$ be the magnetic anisotropy energy of the high Ku layer 2a, $V_h$ be the volume of the high Ku layer 2a, $K_{um}$ be the magnetic anisotropy energy of the intermediate Ku layer 2d, and $V_m$ be the volume of the intermediate Ku layer 2d, $K_{ueff}$ is given by $$K_{ueff} = \frac{K_{uh}V_h + K_{um}V_m}{V_h + V_m} \quad (3)$$

In the above LLG simulations, the magnetic anisotropy energy of the intermediate Ku layer 2d and that of the high Ku layer 2a were adjusted to change $K_{um}/K_{uh}$ so that $K_{ueff}$ became constant. In FIG. 8, a exchange coupling constant Jex between the low Ku layer and the intermediate Ku layer is set to 10 erg/cm$^2$. As is apparent from FIG. 8, as $K_{um}/K_{uh}$ becomes smaller, the spin transfer torque reversal current from the parallel state to the antiparallel state clearly becomes smaller. $K_{um}/K_{uh}=1$ means that the intermediate Ku layer 2d and the high Ku layer 2a have the same magnetic anisotropy energy Ku so that they substantially form a single high Ku layer.

FIG. 9(a) is a graph showing the time dependence of magnetization in spin transfer torque reversal of the magnetoresistive element 1 used in this embodiment. FIG. 9(b) is an enlarged view of the graph shown in FIG. 9(a). As can clearly be confirmed in FIG. 9(b), placing focus on the start of spin transfer torque reversal, when current supply starts, the low Ku layer 2b causes reversal first, and the magnetization reversal sequentially propagates to the intermediate Ku layer 2d and the high Ku layer 2a. When the magnetization reversal smoothly propagates, t-incubation-delay shortens.

As described above, inserting the intermediate Ku layer 2d between the high Ku layer 2a and the low Ku layer 2b makes it possible to smoothly propagate the magnetization reversal and obtain the effect of reducing the write current.

FIG. 8 also shows a write current (switching current) that reverses the magnetization direction from parallel to antiparallel when the exchange coupling constant Jex between the low Ku layer and the intermediate Ku layer is changed from 10 erg/cm$^2$ to 2 erg/cm$^2$. As described in the first embodiment, Jex=2 erg/cm$^2$ is more suitable than Jex=10 erg/cm$^2$. Hence, in the second embodiment, the write current can further be reduced by setting the exchange coupling constant Jex between the low Ku layer 2b and the intermediate Ku layer 2d to 5 erg/cm$^2$ or less. In the first embodiment, actually, the write current decreases to 38% when the value of the exchange coupling constant changes from 10 erg/cm² to 2 erg/cm², as shown in FIG. 3. In the arrangement of the second embodiment, when Kum/Kuh=0.3, as shown in FIG. 8, the write current for the change from parallel to antiparallel can be reduced to 20% by decreasing the value of the exchange coupling constant from 10 erg/cm² to 2 erg/cm² (see the arrow in FIG. 8). In this case, needless to say, inserting a nonmagnetic layer or a magnetic layer or a plasma treatment, oxidation, heating, or the like is suitable for controlling the exchange coupling between the low Ku layer 2b and the intermediate Ku layer 2d, as described in the first embodiment.

The thermal stability of a magnetic layer is represented by $K_{ueff} \times (V_h+V_m)$. In the LLG simulations shown in FIG. 8, since $K_{ueff}$ is constant, the thermal stability does not change. Hence, the result shown in FIG. 8 represents that the reversal current is reduced while maintaining the thermal stability of the magnetic layer. It is also confirmed that the spin transfer torque reversal current reduction effect can also be obtained even when the storage layer includes a plurality of intermediate Ku layers, instead of having the three-layer structure as in this embodiment. Based on these results, using a multilayered structure as the storage layer allows to implement a magnetoresistive element capable of guaranteeing a sufficiently long memory holding time, that is, maintaining the thermal stability of the storage layer and reducing the write current and a magnetic memory using the same.

To actually implement the intermediate Ku layer 2d, a nonmagnetic element or a magnetic metal element is added to the high Ku layer 2a. Alternatively, a nonmagnetic layer or a magnetic metal layer may be inserted into the high Ku layer 2a, and a nonmagnetic element from the nonmagnetic layer or a magnetic metal element from the magnetic metal layer may be added to the high Ku layer 2a by annealing to be performed later. Adding the magnetic metal element or the nonmagnetic element to the high Ku layer 2a allows to change the composition ratio and thus lower Ku. Since the composition ratio can be changed by adding at least one of the magnetic metal element and the nonmagnetic element, Ku can be lowered. As the nonmagnetic element, Ti, V, Cr, Cu, Zn, Zr, Nb, Mo, Ru, Rh, Pd, Ag, Cd, In, Sn, Hf, Ta, W, Re, Os, Ir, Pt, Au, or the like is usable. As the magnetic metal element, Fe, Ni, Co, Mn, or the like is usable. Note that the same material as in the first embodiment can be used as the high Ku layer. For example, an alloy of a magnetic element such as Fe or Co and a rare-earth element such as Nd, Sm, Gd, Tb, or Dy, an artificial lattice or an alloy of a magnetic element such as Fe or Co and a precious metal element such as Pt, Pd, Ir, Ru, Au, or Rh, a CoCr alloy, or the like is usable. As the low Ku layer, the same material as in the first embodiment, that is, a magnetic layer containing Co, for example, CoFe, CoB, CoFeB, CoFeNi, CoFeNiB, or the like is used.

When the high Ku layer 2a is made of an intermetallic compound or an alloy of a nonmagnetic metal element and a magnetic metal element, that is, an intermetallic compound or an alloy containing at least one nonmagnetic metal element selected from the group consisting of Ti, V, Cr, Cu, Zn, Zr, Nb, Mo, Ru, Rh, Pd, Ag, Cd, In, Sn, Hf, Ta, W, Re, Os, Ir, Pt, and Au and at least one magnetic metal element selected from the group consisting of Fe, Ni, Co, and Mn, the intermediate Ku layer 2d can be implemented by changing the composition ratio (content ratio) of the nonmagnetic metal element and the magnetic metal element in the high Ku layer 2a. When the magnetic film is formed by, for example, sputtering, the content ratio of the atoms can continuously be changed very smoothly by continuously changing the discharge power of the metal whose content ratio changes during discharge. At this time, since the optimum atomic content ratio changes depending on the type of the nonmagnetic metal, adjustment is done for each substance, as needed. When such an intermediate Ku layer is used, and the composition ratio of the magnetic layer is analyzed on the low Ku layer or spacer side and on the electrode side, the magnetic layer has different compositions on these sides, as its characteristic feature. Note that the same material as in the first embodiment, for example, MgO, Al₂O₃, Cu, or Au is used as the spacer layer 4.

As described above, according to this embodiment, it is possible to reduce the write current without deteriorating the thermal stability of the storage layer.

Third Embodiment

Figure 10:
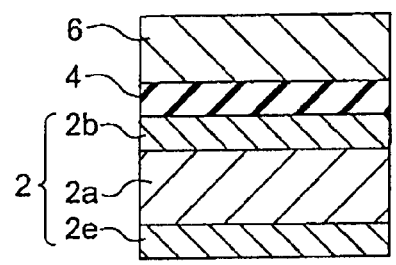
FIG. 10 is a sectional view showing a magnetoresistive element used in the third embodiment.

A magnetic memory according to the third embodiment will be described next with reference to FIG. 10. The magnetic memory of this embodiment includes at least one memory cell. This memory cell includes a magnetoresistive element serving as a memory element. FIG. 10 illustrates the magnetoresistive element used in the magnetic memory of this embodiment. A magnetoresistive element 1 includes a storage layer 2, a reference layer 6, and a spacer layer 4 provided between the storage layer 2 and the reference layer 6. The storage layer 2 includes a high Ku layer 2a, a low Ku layer 2b, and a low Ku layer 2e. The low Ku layer 2b is provided between the high Ku layer 2a and the spacer layer 4. The low Ku layer 2e is provided on a side opposite to the low Ku layer 2b with respect to the high Ku layer 2a. Note that the same material as in the first embodiment can be used as the high Ku layer. For example, an alloy of a magnetic element such as Fe or Co and a rare-earth element such as Nd, Sm, Gd, Tb, or Dy, an artificial lattice or an alloy of a magnetic element such as Fe or Co and a precious metal element such as Pt, Pd, Ir, Ru, Au, or Rh, a CoCr alloy, or the like is usable. As the low Ku layers 2b and 2e, the same material as in the first embodiment, that is, a magnetic layer containing Co, for example, CoFe, CoB, CoFeB, CoFeNi, CoFeNiB, or the like is used. When MgO is used as the spacer layer 4, a magnetic layer containing Co and B is preferably used as the low Ku layer 2b on the side of the spacer layer 4. When B is contained, the MR ratio of the magnetoresistive element can be made large. Note that the same material as in the first embodiment, for example, MgO, Al₂O₃, Cu, or Au is used as the spacer layer 4.

Figure 11:
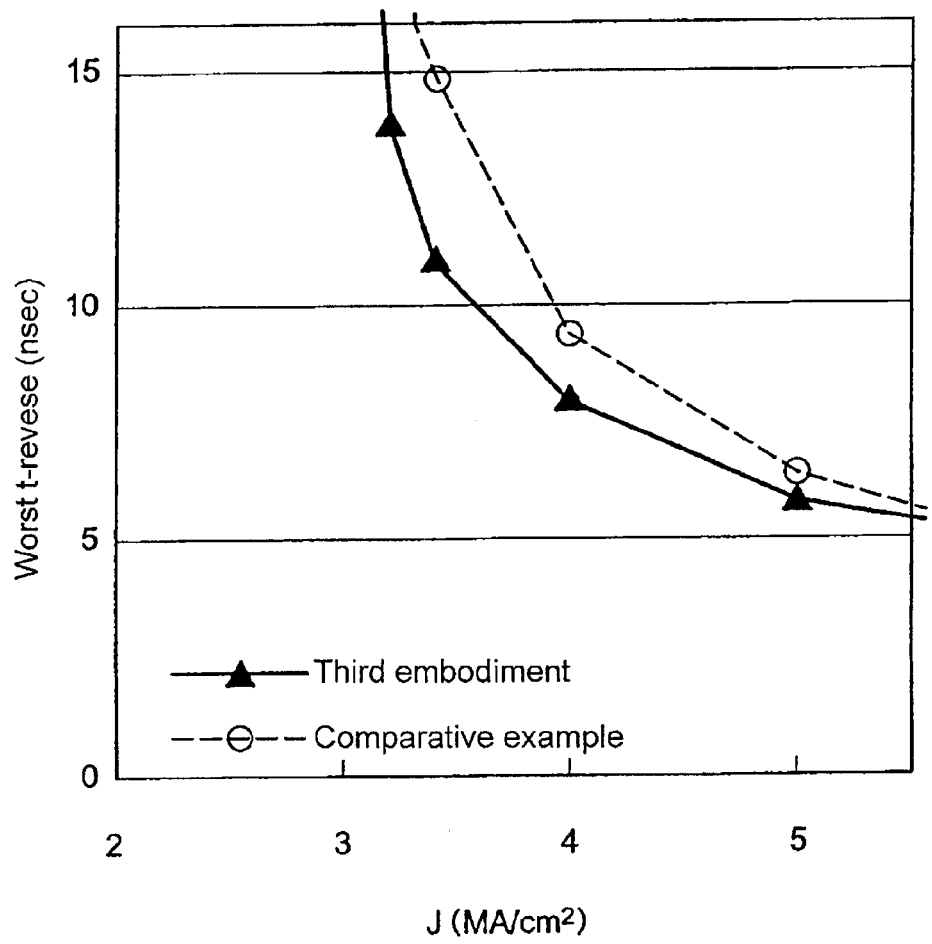
FIG. 11 is a graph showing the result of LLG simulations of the magnetoresistive element of the third embodiment and a magnetoresistive element of a comparative example.

As described in the first embodiment, since the low Ku layer 2b is provided adjacent to the spacer layer 4, t-incubation-delay shortens as compared to a case in which the storage layer includes only the high Ku layer 2a. This is probably because the magnetization of the low Ku layer 2b starts coherent precession first. In this embodiment, t-reverse shortens. This will be described with reference to FIG. 11. FIG. 11 shows the result of LLG simulations of the magnetoresistive element 1 used in this embodiment shown in FIG. 10 and a magnetoresistive element of a comparative example having the same arrangement as that of the magnetoresistive element shown in FIG. 10 except that the storage layer is formed from the high Ku layer 2a. When the simulation is repeated under the same condition, the times t-reverse are distributed in accordance with the logarithmic normal distribution. Outliers deviated from the median of t-reverse by 6σ are plotted along the ordinate as worst values, where σ represents the standard deviation. To shorten the outliers is important in reducing write current errors. As is apparent from FIG. 11, when the low Ku layer 2e is provided outside the high Ku layer 2a, t-reverse shortens as compared to a single-layered storage layer having the same memory holding time. This is probably because the magnetization of the low Ku layer 2e rotates first, and the high Ku layer 2a follows then.

FIG. 12 is a graph that plots, as the function of a current density J, the σ values of the logarithmic normal distribution of t-reverse in magnetic memories having, as memory elements, the magnetoresistive elements according to this embodiment, the first embodiment in which the storage layer is formed from the high Ku layer 2a and the low Ku layer 2b, and the comparative example in which the storage layer is formed from a single layer. As is apparent from FIG. 12, when the low Ku layer 2b is provided as in the first embodiment, or the low Ku layer 2e is provided as in the third embodiment, the standard deviation σ becomes smaller as compared to the comparative example having the storage layer formed from a single layer with the same memory holding time. In the comparative example in which the storage layer is formed from a single layer, the standard deviation σ is large because the magnetization reversal stays in the intermediate state between the two magnetic domains near Mz=0. However, when the low Ku layer 2b and the low Ku layer 2e are added, as in this embodiment, the standard deviation σ supposedly decreases because the domain wall width of the high Ku layer apparently increases, and the intermediate state between the two magnetic domains is not so stable. A domain wall width δW is given by $\delta W = \pi (A/Ku)^{1/2}$. Ku of the low Ku layer 2b and the low Ku layer 2e is preferably 1/100 or less of that of the high Ku layer 2a. This is because the domain wall width in the low Ku layer 2b and the low Ku layer 2e is 10 times or more of that in the high Ku layer 2a and becomes much larger than the diameter of the storage layer. When the domain wall width is much larger than the diameter of the storage layer, the intermediate state between the two magnetic domains is not stable and rarely appears. Note that A is the average exchange stiffness constant of the high Ku layer and the low Ku layer. Hence, using the magnetoresistive element 1 shown in FIG. 10 as the memory element enables to reduce the fluctuation of the threshold and suppress write errors and read errors.

First to fourth magnetic memories are prepared. The first magnetic memory includes, as the memory element, the magnetoresistive element shown in FIG. 10 in which the exchange coupling constant Jex between the low Ku layer 2b and the high Ku layer 2a is 10 erg/cm², and the exchange coupling constant Jex between the high Ku layer 2a and the low Ku layer 2e is 10 erg/cm². The second magnetic memory includes, as the memory element, a magnetoresistive element having the same arrangement as that of the magnetoresistive element shown in FIG. 10 except that the storage layer 2 includes only the high Ku layer 2a. The third magnetic memory includes, as the memory element, the magnetoresistive element shown in FIG. 10 in which the exchange coupling constant Jex between the low Ku layer 2b and the high Ku layer 2a is 2 erg/cm², and the exchange coupling constant Jex between the high Ku layer 2a and the low Ku layer 2e is 10 erg/cm². The fourth magnetic memory includes, as the memory element, the magnetoresistive element shown in FIG. 10 in which the exchange coupling constant Jex between the low Ku layer 2b and the high Ku layer 2a is 10 erg/cm², and the exchange coupling constant Jex between the high Ku layer 2a and the low Ku layer 2e is 2 erg/cm².

A reversal current density (write current density) Jc for reversing the magnetization of the storage layer is measured in each of the first to fourth magnetic memories. FIGS. 13(a), 13(b), 13(c), and 13(d) show the measurement results.

Figure 13:
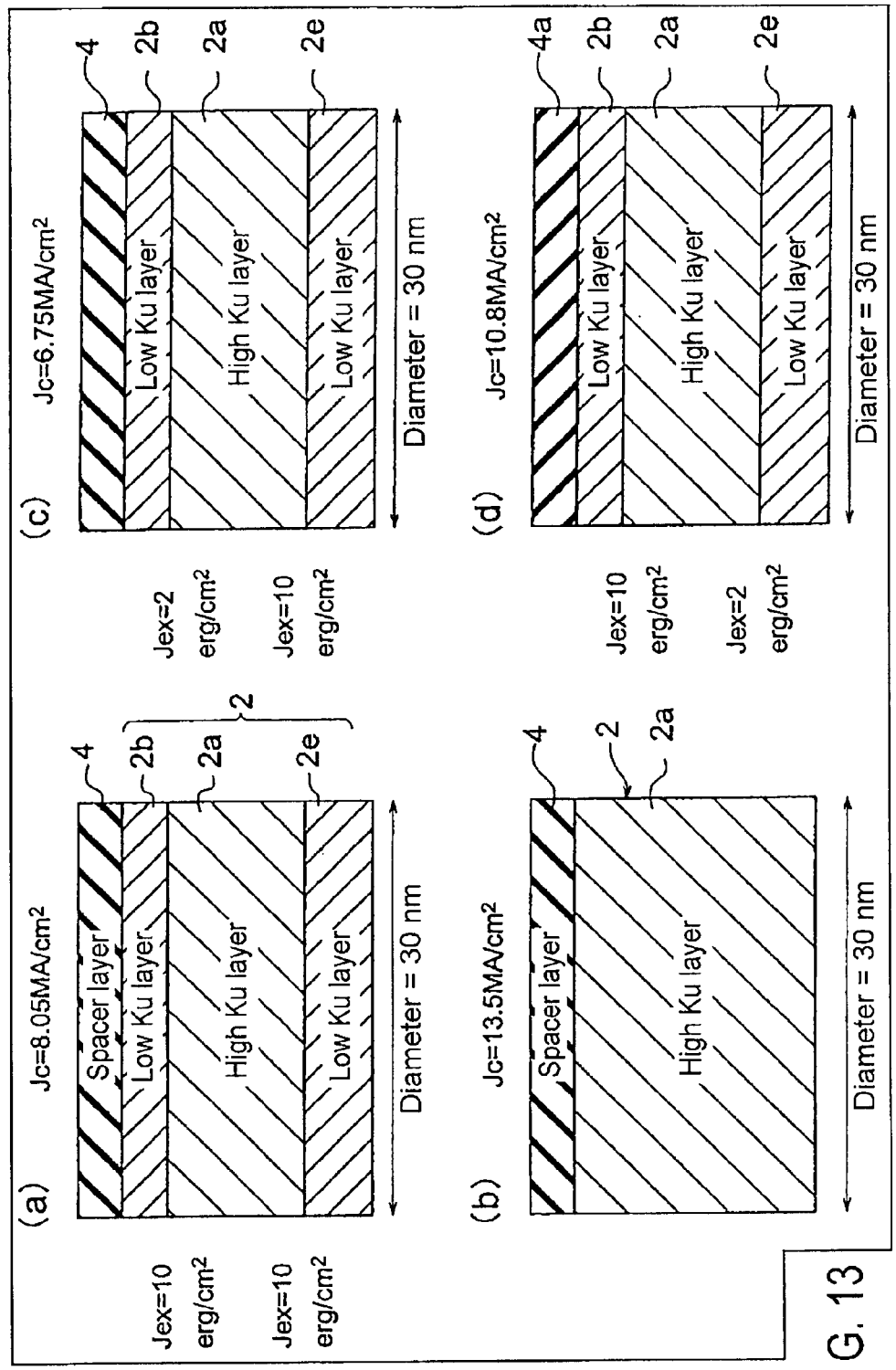
FIG. 13 is a view showing the arrangement and characteristics of first to fourth magnetic memory.

The first to fourth magnetic memories are set to have the same thermal stability of the storage layer 2. In the first magnetic memory shown in FIG. 13(a), the write current density Jc decreases to 0.6 times that of the second magnetic memory shown in FIG. 13(b). In the first magnetic memory shown in FIG. 13(a), the exchange coupling constant between the magnetic layers is as large as 10 erg/cm². When the exchange coupling constant between the high Ku layer 2a and the low Ku layer 2b is decreased to 2 erg/cm², as in the third magnetic memory shown in FIG. 13(c), the write current density Jc decreases to 0.5 times, as compared to the memory shown in FIG. 13(b). Reducing the exchange coupling between the low Ku layer 2e and the high Ku layer 2a, as in the fourth magnetic memory shown in FIG. 13(d), is not so effective for reducing the write current density Jc.

Figure 17:
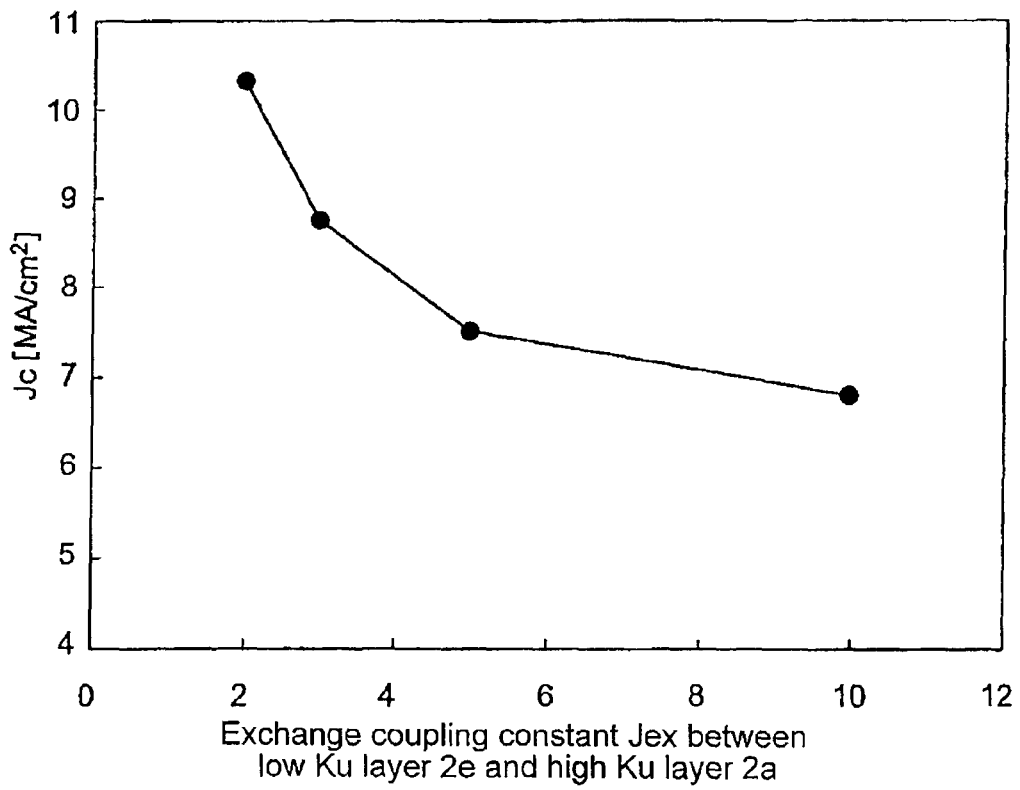
FIG. 17 is a graph showing the dependence of the write current density Jc on the exchange coupling constant between a low Ku layer and a high Ku layer.

As is apparent from the above explanation, in this embodiment as well, the smaller exchange coupling between the high Ku layer 2a and the low Ku layer 2b on the side of the spacer layer 4 is suitable for reducing the write current. On the other hand, the exchange coupling between the high Ku layer 2a and the low Ku layer 2e arranged on the side opposite to the spacer layer 4 is suitably larger than that between the low Ku layer 2b and the high Ku layer 2a. This is probably because when the exchange coupling constant Jex between the low Ku layer 2e and the high Ku layer 2a is as small as 2 erg/cm², as shown in FIG. 13(d), the fluctuation of t-reverse becomes large, and the effect of reducing the write current consequently becomes smaller. FIG. 17 show the dependence of the write current density Jc on the exchange coupling constant Jex between the low Ku layer 2e and the high Ku layer 2a. The write current abruptly increases when the exchange coupling constant Jex is lower than 5 erg/cm². This reveals that Jex=5 erg/cm² or more is suitable for reducing the write current. Note that Jex can be controlled using the methods described in the first embodiment.

Another advantage of this embodiment using the magnetoresistive element shown in FIG. 10 is the higher MR ratio. When the low Ku layer 2b and the low Ku layer 2e are placed adjacent to the spacer layer 4 together, the magnetization of the low Ku layer tilts, and the MR ratio consequently lowers. This problem can be avoided by dividing the low Ku layer into the low Ku layer 2b and the low Ku layer 2e.

Figure 14:
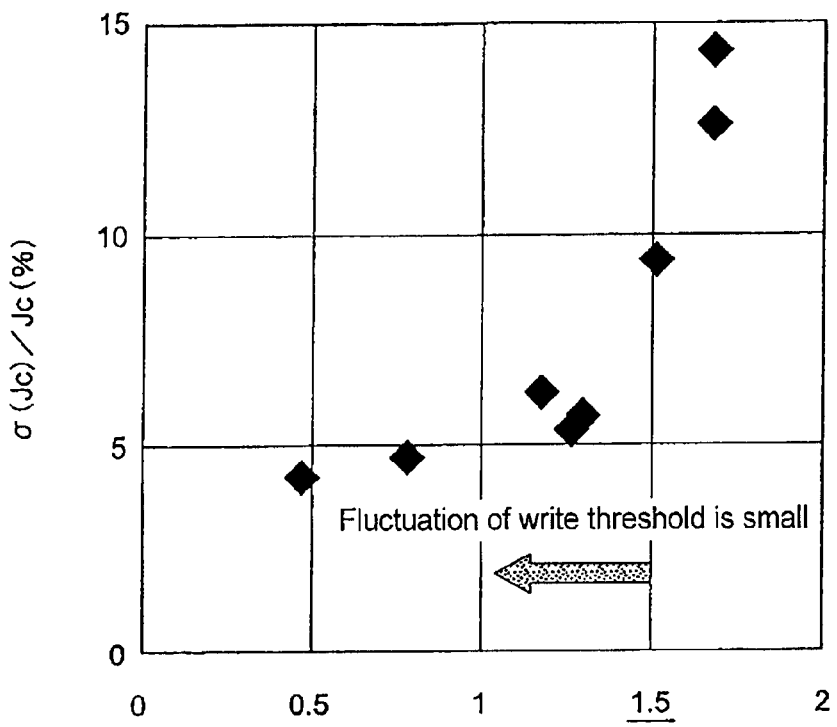
FIG. 14 is a graph showing the result of LLG simulations of the diameter dependence of a storage layer concerning the fluctuation of a write current density Jc.

FIG. 14 shows the result of LLG simulations of the diameter dependence of the storage layer concerning the fluctuation of the write current density Jc when the storage layer has the two-layer structure including the low Ku layer and the high Ku layer (for example, first embodiment). The abscissa represents a diameter D of the storage layer normalized by Ds, and the ordinate represents the variation a (Jc) of the write current density Jc normalized by the write current density Jc. Ds represents the diameter of the MTJ element which ensures the same energy barrier in the process of causing reversal through two magnetic domains and the process of causing reversal along the axis of hard magnetization in a single magnetic domain in the magnetization reversal process. When the diameter of the storage layer is equal to or smaller than Ds, the storage layer can take the magnetization reversal process in the single magnetic domain. The present inventors have found that Ds of a multilayered storage layer formed from the high Ku layer 2a and one of the low Ku layer 2b and the low Ku layer 2e is given by $$D_s = \frac{6\sqrt{A}\left(\sqrt{K_{u1}}\, t_1 + \sqrt{|K_{u2}|}\, t_2\right)}{(K_{u1}t_1 + K_{u2}t_2) - 2\pi(M_s^{av})^2\left(N_a - \frac{1}{2}\right)(t_1 + t_2)} \quad (4)$$

where Ku is the magnetic anisotropy energy density, and t is the thickness. Suffix "1" represents the high Ku layer, and "2", the low Ku layer. A and $M_s^{av}$ are the average exchange stiffness constant and the average saturation magnetization of the high Ku layer and the low Ku layer, and Na is the demagnetizing factor in the film thickness direction of a cylinder having the diameter Ds and a thickness $t_1+t_2$.

Note that equation (4) can also be used for a three-layer structure (for example, third embodiment) in which the storage layer includes the low Ku layer $2b$, the high Ku layer $2a$, and the low Ku layer $2e$. In this case, $K_{U2}$ represents the average value of $K_U$ of the low Ku layer $2b$ and $K_U$ of the low Ku layer $2e$, and $t_2$ represents the sum of the thickness of the low Ku layer $2b$ and the thickness of the low Ku layer $2e$.

As is apparent from FIG. 14, when D/Ds is 1.5 or more, the variation in the write current density Jc abruptly becomes large. When the fluctuation of Jc is large, write errors increase. To sufficiently reduce the write errors (for example, reduce the probability to $1\times10^{-10}$ or less), a large write current is necessary. Hence, making D smaller than 1.5 times of Ds is suitable for suppressing write errors and reducing the write current. In the single-layered storage layer, conventionally, D≦Ds is preferable. However, the present inventors have proved that D>1.5Ds is preferable for the multilayered storage layer from the viewpoint of the fluctuation of the write current density Jc. The present inventors have found that when the low Ku layer (or outer low Ku layer) is stacked on the storage layer including only the high Ku layer, Ds increases in accordance with equation (4). If the diameter D is the same, the fluctuation of the write current density Jc is suppressed by the stacking. Equation (4) is different from both the equation of the single-layered storage layer and the equation obtained by averaging Ku of the low Ku layer and the high Ku layer and substituting it into the equation of the single-layered storage layer. Equation (4) represents the effect specific to the multilayered storage layer.

According to this embodiment, it is possible to reduce the write current without deteriorating the thermal stability of the storage layer.

As described above, according to the first to third embodiments, it is possible to reduce the write current without deteriorating the thermal stability of the storage layer. That is, it is possible to guarantee a sufficiently long memory holding time and reduce the write current. It is also possible to largely decrease the probability of operation errors caused by write, read, and memory holding errors which occur because the magnetization reversal of a magnetic body is a probabilistic phenomenon.

Fourth Embodiment

A magnetic memory according to the fourth embodiment will be described next with reference to FIGS. 15 and 16.

Figure 15:
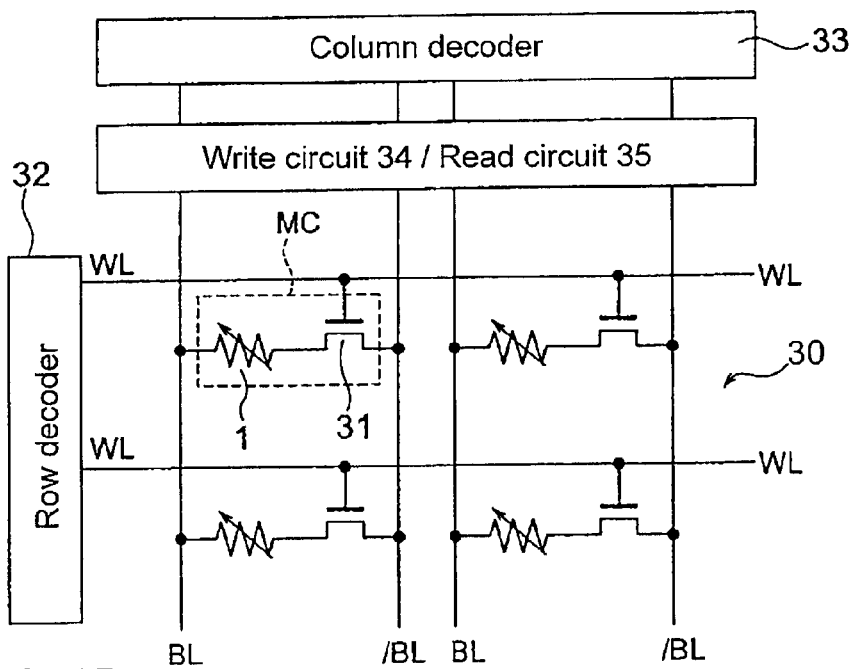
FIG. 15 is a circuit diagram showing a magnetic memory according to the fourth embodiment.
Figure 16:
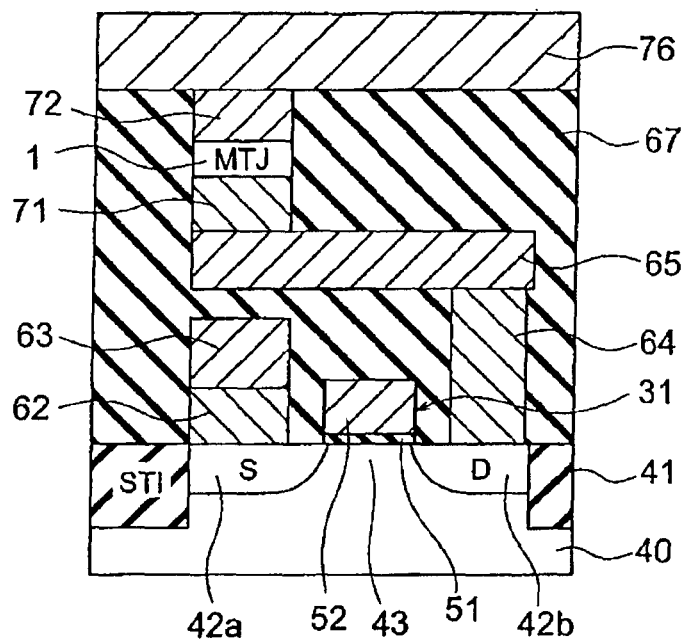
FIG. 16 is a sectional view showing a memory cell of the magnetic memory according to the fourth embodiment.

FIG. 15 is a circuit diagram of an MRAM according to this embodiment. The MRAM of this embodiment uses, as the memory element of a memory cell, a magnetoresistive element (MTJ element) 1 shown in FIG. 2, 6, 7, or 10 described in the first embodiment, the modification thereof, the second embodiment, and the third embodiment. This MRAM includes a memory cell array 30 including a plurality of memory cells MC arrayed in a matrix. A plurality of pairs of bit lines BL and /BL are formed on the memory cell array 30 so as to run in the column direction. In addition, a plurality of word lines WL are formed on the memory cell array 30 so as to run in the row direction.

The memory cells MC are arranged at the intersections between the bit lines BL and the word lines WL. Each memory cell MC includes the MTJ element 1, and a select transistor 31 formed from an NMOS transistor. One terminal of the MTJ element 1 is connected to the bit line BL. The other terminal of the MTJ element 1 is connected to the drain terminal of the select transistor 31. The gate terminal of the select transistor 31 is connected to the word line WL. The source terminal of the select transistor 31 is connected to the bit line /BL.

A row decoder 32 is connected to the word lines WL. A write circuit 34 and a read circuit 35 are connected to the pairs of bit lines BL and /BL. A column decoder 33 is connected to the write circuit 34 and the read circuit 35. Each memory cell MC is selected by the row decoder 32 and the column decoder 33.

Data write to the memory cell MC is performed in the following way. First, to select the memory cell MC for the data write, the word line WL connected to the memory cell MC is activated. The select transistor 31 is thus turned on. A bidirectional write current Iw is supplied to the MTJ element 1 based on the write data. More specifically, to supply the write current Iw to the MTJ element 1 from left to right in FIG. 15, the write circuit 34 applies a positive voltage to the bit line BL and the ground voltage to the bit line /BL. To supply the write current Iw to the MTJ element 1 from right to left in FIG. 15, the write circuit 34 applies a positive voltage to the bit line /BL and the ground voltage to the bit line BL. Data "0" or data "1" can thus be written to the memory cell MC.

Data read from the memory cell MC is performed in the following way. First, to select the memory cell MC for the data read, the word line WL connected to the memory cell MC is activated. The select transistor 31 of the selected memory cell MC is thus turned on. The read circuit 35 supplies a read current Ir flowing, for example, from right to left in FIG. 15 to the MTJ element 1. The read circuit 35 detects the resistance value of the MTJ element 1 based on the read current Ir. Data stored in the MTJ element 1 can thus be read.

The structure of the MRAM will be described next. FIG. 16 is a sectional view showing the arrangement of the MRAM with focus on one memory cell MC.

An element isolation layer 41 is provided in the surface region of a p-type semiconductor substrate 40. A surface region of the semiconductor substrate 40 where the element isolation layer 41 is not provided is the element region (active area) where the element is formed. The element isolation layer 41 is formed from, for example, STI (Shallow Trench Isolation). As the STI, for example, silicon oxide is used.

The select transistor 31 is formed in the element region of the semiconductor substrate 40. The select transistor 31 is provided with a source region $42a$ and a drain region $42b$ which are spaced part from each other. Each of the source region $42a$ and the drain region $42b$ is made of an $n^+$-type diffusion region formed by heavily doping the semiconductor substrate 40 with an $n^+$-type impurity. A gate insulating film 51 is formed on the region of the semiconductor substrate 40 as a prospective channel 43 between the source region $42a$ and the drain region $42b$. A gate electrode 52 is provided on the gate insulating film 51.

The gate electrode 52 functions as the word line WL.

An interconnection layer 63 is provided on the source region $42a$ via a contact 62. The interconnection layer 63 functions as the bit line /BL. A lead 65 is provided on the drain region $42b$ via a contact 64. The MTJ element 1 sandwiched between a lower electrode 71 and an upper electrode 72 is provided on the lead 65. An interconnection layer 76 is provided on the upper electrode 72. The interconnection layer 76 functions as the bit line BL. The space between the semiconductor substrate 40 and the interconnection layer 76 is filled with an interlayer dielectric film 67 made of, for example, silicon oxide.

According to this embodiment, the MRAM can be formed using the MTJ element 1 according to one of the first embodiment, the modification thereof, the second embodiment, and the third embodiment.

In this embodiment as well, it is possible to reduce the write current without deteriorating the thermal stability of the storage layer, as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising a magnetoresistive element, the magnetoresistive element comprising:
a reference layer having an invariable magnetization direction;
a storage layer having a variable magnetization direction; and
a spacer layer provided between the reference layer and the storage layer, and
wherein the storage layer has a multilayered structure including a first magnetic layer and a second magnetic layer,
the second magnetic layer is provided between the first magnetic layer and the spacer layer and has a magnetic anisotropy energy lower than that of the first magnetic layer,
an exchange coupling constant Jex between the first magnetic layer and the second magnetic layer is not more than 5 erg/cm², and
a metal layer is provided between the first magnetic layer and the second magnetic layer, and contains at least one element selected from the group consisting of Fe, Ni, and Co.

2. A magnetic memory comprising a magnetoresistive element, the magnetoresistive element comprising:
a reference layer having an invariable magnetization direction;
a storage layer having a variable magnetization direction; and
a spacer layer provided between the reference layer and the storage layer, and
wherein the storage layer has a multilayered structure including a first magnetic layer and a second magnetic layer,
the second magnetic layer is provided between the first magnetic layer and the spacer layer and has a magnetic anisotropy energy lower than that of the first magnetic layer,
an exchange coupling constant Jex between the first magnetic layer and the second magnetic layer is not more than 5 erg/cm², and
the storage layer further comprises a third magnetic layer provided on a side opposite to the second magnetic layer with respect to the first magnetic layer and has a magnetic anisotropy energy lower than that of the first magnetic layer.

3. The magnetic memory according to claim 2, wherein an exchange coupling constant Jex between the first magnetic layer and the third magnetic layer is not less than 5 erg/cm².

4. A magnetic memory comprising a magnetoresistive element, the magnetoresistive element comprising:
a reference layer having an invariable magnetization direction;
a storage layer having a variable magnetization direction; and
a spacer layer provided between the reference layer and the storage layer, and
wherein the storage layer has a multilayered structure including a first magnetic layer and a second magnetic layer,
the second magnetic layer is provided between the first magnetic layer and the spacer layer and has a magnetic anisotropy energy lower than that of the first magnetic layer,
an exchange coupling constant Jex between the first magnetic layer and the second magnetic layer is not more than 5 erg/cm², and
the storage layer further comprises a fourth magnetic layer provided on a side opposite to the second magnetic layer with respect to the first magnetic layer and has a magnetic anisotropy energy higher than that of the first magnetic layer.

5. The magnetic memory according to claim 4, wherein at least one magnetic metal element selected from the group consisting of Co, Fe, Ni, and Mn or at least one nonmagnetic element selected from the group consisting of Ti, V, Cr, Cu, Zn, Zr, Nb, Mo, Ru, Rh, Pd, Ag, Cd, In, Sn, Hf, Ta, W, Re, Os, Ir, Pt, and Au is added to the first magnetic layer.

6. The magnetic memory according to claim 4, wherein the first magnetic layer and the fourth magnetic layer are essentially made of a compound or an alloy containing at least one magnetic metal element selected from the group consisting of Co, Fe, Ni, and Mn and at least one nonmagnetic element selected from the group consisting of Ti, V, Cr, Cu, Zn, Zr, Nb, Mo, Ru, Rh, Pd, Ag, Cd, In, Sn, Hf, Ta, W, Re, Os, Ir, Pt, and Au, and a composition ratio of the magnetic metal element and the nonmagnetic element changes between the first magnetic layer and the fourth magnetic layer.

7. The magnetic memory according to claim 1, wherein letting $K_{U1}$ be a magnetic anisotropy energy density of the first magnetic layer, $t_1$ be a thickness of the first magnetic layer, $K_{U2}$ be a magnetic anisotropy energy density of the second magnetic layer, $t_2$ be a thickness of the second magnetic layer, A be an average exchange stiffness constant of the first magnetic layer and the second magnetic layer, $M_s^{av}$ be an average saturation magnetization of the first magnetic layer and the second magnetic layer, $D_s$ be a diameter of the magnetoresistive element which ensures the same energy barrier in a process of causing reversal through two magnetic domains and a process of causing reversal along an axis of hard magnetization in a single magnetic domain in a magnetization reversal process, and Na be a demagnetizing factor in a film thickness direction of the multilayered structure including the first magnetic layer and the second magnetic layer, the diameter $D_s$ is given by $$D_s = \frac{6\sqrt{A}\left(\sqrt{K_{u1}}\,t_1 + \sqrt{|K_{u2}|}\,t_2\right)}{(K_{u1}t_1 + K_{u2}t_2) - 2\pi(M_s^{av})^2\left(N_a - \frac{1}{2}\right)(t_1 + t_2)}$$

and a diameter D of the storage layer satisfies $D < 1.5\,D_s$.

* * * * *

UNITED STATES PATENT AND TRADEMARK OFFICE
CERTIFICATE OF CORRECTION

| | | |
|---|---|---|
| PATENT NO. | : 8,530,987 B2 | |
| APPLICATION NO. | : 13/432486 | |
| DATED | : September 10, 2013 | |
| INVENTOR(S) | : Hisanori Aikawa et al. | |

It is certified that error appears in the above-identified patent and that said Letters Patent is hereby corrected as shown below:

On the title page, (63) change "Continuation of application No. PCT/JP2009/006775, filed on Sep. 28, 2009." to --Continuation of application No. PCT/JP2009/066775, filed on Sep. 28, 2009.--

Signed and Sealed this
Eighteenth Day of February, 2014

Michelle K. Lee
*Deputy Director of the United States Patent and Trademark Office*